United States Patent [19]

Shigetaka et al.

[11] Patent Number: 5,307,106
[45] Date of Patent: Apr. 26, 1994

[54] WASTE SOLUTION DISCHARGING APPARATUS FOR WATERLESS LITHOGRAPHIC PRINTING PLATES

[75] Inventors: Seiji Shigetaka; Susumu Yoshida, both of Shizuoka, Japan

[73] Assignee: Fuji Photo Film Co., Ltd., Kanagawa, Japan

[21] Appl. No.: 897,016

[22] Filed: Jun. 11, 1992

[30] Foreign Application Priority Data

Jun. 14, 1991 [JP] Japan .................................. 3-143113

[51] Int. Cl.$^5$ .............................................. G03D 5/00
[52] U.S. Cl. .................................................. 354/317
[58] Field of Search ................ 354/324, 317, 318; 222/437; 188/268; 116/114 AH; 261/1; 177/207; 73/293, 49.2

[56] References Cited

U.S. PATENT DOCUMENTS

| | | | |
|---|---|---|---|
| 3,864,249 | 2/1975 | Wallis | 209/1 |
| 3,933,211 | 1/1976 | Schmid | 177/207 |
| 4,125,085 | 11/1978 | Rubey | 116/114 AH |
| 4,141,939 | 2/1979 | Oshima | 261/1 |
| 4,431,019 | 2/1984 | Kopp et al. | 137/87 |
| 4,440,271 | 4/1984 | Boreas | 188/268 |
| 4,517,282 | 5/1985 | Tomisawa et al. | 430/399 |
| 4,593,986 | 6/1986 | Tomisawa et al. | 354/324 |
| 4,606,866 | 8/1986 | McGlothlin et al. | 73/293 X |
| 4,880,724 | 11/1989 | Toyama et al. | 354/318 X |
| 4,881,667 | 11/1989 | Perakis | 222/437 |
| 5,055,870 | 10/1991 | Ohba et al. | 354/317 |
| 5,209,106 | 5/1993 | Carlin | 73/49.2 |

FOREIGN PATENT DOCUMENTS

| | | |
|---|---|---|
| 3238134 | 10/1982 | Fed. Rep. of Germany . |
| 44-23042 | 10/1969 | Japan . |
| 46-16044 | 4/1971 | Japan . |
| 48-94504 | 12/1973 | Japan . |
| 50-50102 | 5/1976 | Japan . |
| 2-216157 | 8/1990 | Japan . |
| 2-220061 | 9/1990 | Japan . |

*Primary Examiner*—D. Rutledge
*Attorney, Agent, or Firm*—Sughrue, Mion, Zinn, Macpeak & Seas

[57] ABSTRACT

A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in the accommodating tank, and a replenishing solution is replenished periodically. The waste solution discharging apparatus for waterless lithographic printing plates discharges the processing solution, which is within the accommodating tank and which contains scrapings generated after development, as waste solution. In the waste solution discharging apparatus for waterless lithographic printing plates, a processing solution inflow opening of a discharge pipe, which discharges the processing solution in the processing tank along with the scrapings, is formed of a material having low surface tension, and/or the waste solution discharging apparatus is provided with a guide member which guides the scrapings to the processing solution inflow opening. Accordingly, the processing solution which includes the scrapings smoothly flows into the discharge pipe.

24 Claims, 8 Drawing Sheets

WASTE SOLUTION DISCHARGING APPARATUS FOR WATERLESS LITHOGRAPHIC PRINTING PLATES

BACKGROUND OF THE INVENTION

1. Field of the Invention

The present invention relates to a waste solution discharging apparatus for waterless lithographic printing plates which is used to discharge waste solution including scrapings which are generated after developing.

2. Description of the Related Art

Various waterless PS plates in which a silicone layer is used as an ink-resistant layer have been proposed. A waterless PS plate in which a light-soluble or a light-insoluble photosensitive layer and a silicone rubber layer are laminated on a base is disclosed in Japanese Patent Application Publication Nos. 44-23042 and 46-16044. Japanese Patent Application Laid-Open Nos. 48-94504 and 50-50102 disclose a waterless PS plate in which a light-adhesive photosensitive layer and a silicone rubber layer are laminated on a base. With these plates, several tens of thousands of prints can be printed without the use of dampening water.

The above-mentioned waterless PS plates are formed by laminating a photosensitive layer and a silicone rubber layer on a supporting body made of aluminum or the like. The top surfaces of these layers are laminated with a protective film so that the surfaces are protected. When an image is printed onto the waterless PS plate, the photosensitive layer hardens in accordance with the amount of exposure, and further adheres to the silicone rubber layer. In this state, when developer is supplied to the surface, the photosensitive layer swells due to the developer as much as unexposed portions and portions where there is little amount of exposure, and the silicone rubber layer is peeled off. These scrapings of the peeled off silicone rubber layer are recovered in the developer recovery tank along with the excess developer. The recovered developing solution is returned by the circulating pump to a developing solution supplying portion, and is supplied to the waterless lithographic printing plate.

There are various developers used in developing processing, including the following examples:

| Developer 1 | |
|---|---|
| diethylene glycol-mono-n-hexyl ether | 15 part by weight |
| diethylene glycol-mono-ethyl ether | 17 part by weight |
| pure water | 68 part by weight |
| Developer 2 | |
| diethylene glycol-mono-hexyl ether | 10 part by weight |
| Newcol B4SN (60% aqueous solution) | 4.5 weight % |
| pure water | 85.5 part by weight |

For waterless development, use of a processing solution containing no organic matter (hereinafter called developing solution) has been proposed (see Japanese Patent Application No. 3-9558, Publication No. 1). This improves the quality of the PS plate itself by making processing without use of organic matter possible. As a result, tap water can be used, and there is no need to dispose of organic matter. There is therefore no environmental pollution.

However, when water being used as developing solution is used repeatedly in order to conserve resources, the scrapings in the developing solution, which are mainly silicone rubber, are recovered to the developing solution recovery tank. The scrapings adhere to the interior of the developing solution resupplying tank, thereby dirtying the developing solution resupplying tank. As a result, it is necessary to periodically clean the developing solution resupplying tank, and the maintenance thereof is complex.

Efforts have been made to place a filter in the circulating path, which supplies the developing solution from the developing solution recovery tank to the developing tank, in order to remove the scrapings from the developing solution circulating in the developing tank, the developing recovery tank and the circulating path. However, in this case, the filter gradually becomes blocked so that the predetermined amount of developer cannot circulate. As a result, the filter must be periodically changed, which requires labor.

In order to solve the above drawback, the following method has been proposed. The surface portion of the developing solution within the developing solution resupplying tank, in which the scrapings are floating, is recovered to a separate tank (collection tank) so that the developing solution remaining in the developing solution recovery tank (the developing solution other than the surface portion) is separated. The separated surface portion of the developing solution, which includes the scrapings, flows into a conduit of a discharge pipe, whose opening is in a vicinity of the surface of the solution, and is discharged as so-called waste solution. The remaining developing solution is circulated and used. Discharge of only the waste solution containing many scrapings is thereby effected.

Further, the discharge pipe is formed from a vinyl chloride pipe such that the cost is low and the manufacturing is easy.

However, scrapings which should flow into the discharge pipe may remain due to contact resistance with the discharge pipe such that the scrapings may not flow smoothly into the discharge pipe.

FIG. 6 illustrates the relationship between the processed amount of the waterless PS plate and the residual rate of the scrapings (silicone scrapings). Even if a vinyl chloride pipe is used as the discharge pipe to discharge the scrapings from the developing solution recovery tank, the residual rate is 5% for a 10 $m^2$ amount to be processed, 40% for a 20 $m^2$ amount, and 50% for a 30 $m^2$ amount. The residual rate of the scrapings rises steeply in accordance with an increase in the processed amount.

A cause of this phenomenon is that the wettability of the material of the discharge pipe greatly effects the residual rate. Wettability is exhibited in the surface tension of a solid body. Namely, as mentioned above, vinyl chloride is used as a material for conventional discharge pipes. The surface tension of vinyl chloride is 41.9 mN/m(dyn/cm). As the value of the surface tension increases, the contact resistance of the floating scrapings to the periphery of the discharge pipe increases, and it is easier for the scrapings to remain thereat.

Further, another cause is that the opening end portion of a conventional discharge pipe is cut in a direction perpendicular to the axis. Therefore, the opening surface faces straight up. Namely, because the scrapings have certain thicknesses, the undersides thereof encounter resistance when the scrapings cross over the angled portion of the outermost periphery of the opening portion end surface. This increases the likelihood of the scrapings remaining thereat.

SUMMARY OF THE INVENTION

With the aforementioned in view, an object of the present invention is to provide a waste solution discharge apparatus for waterless lithographic printing plates which prevents processing solution, such as developing solution or the like, which is within a processing tank, such as a developing solution recovery tank or the like, and which contains scrapings, from remaining on the periphery of a processing solution inflow portion, such as a discharge pipe or the like, so that the processing solution may be discharged, and in which the waste solution is made to flow smoothly into the discharge pipe in order to be discharged.

In a first aspect of the present invention, the waste solution discharging apparatus for waterless lithographic printing plates is used in a waterless lithographic printing plate developing apparatus, in which a waterless lithographic printing plate is developed while processing solution inside an accommodating tank is pumped out by a circulating pump, supplied to the waterless lithographic printing plate, and recovered in the accommodating tank, and replenishing solution is replenished periodically. The waste solution discharging apparatus for waterless lithographic printing plates discharges the processing solution, which is within the accommodating tank and which contains scrapings generated after development, as waste solution. The waste solution discharging apparatus includes an inflow portion positioned within the accommodating tank and having an opening into which processing solution of a surface portion which includes floating scrapings flows as waste solution. Material of at least a vicinity of the opening of the inflow portion is a material having low surface tension so that a resistance when the scrapings flow into the opening is reduced. The waste solution discharging apparatus also has a discharge portion communicating with the inflow portion and discharging the processing solution, flowing in said inflow portion, to an exterior of the accommodating tank.

According to the first aspect of the present invention structured as described above, the scrapings are included in the processing solution which is recovered within the accommodating tank. The scrapings in the processing solution within the accommodating tank float on the surface portion. After the waterless lithographic printing plate is developed, the processing solution is again recovered within the accommodating tank.

The surface portion of the processing solution within the accommodating tank flows into the opening of the inflow portion, and is discharged to an exterior of the processing tank from the discharge portion which communicates with the inflow portion.

At least the vicinity of the opening of the inflow portion is formed of a material having low surface tension, which is related to wettability, so that the contact resistance of the vicinity and the scrapings is low. The remaining of the scrapings on the periphery of the inflow portion is thereby managed. As a result, the waste solution can be guided smoothly out of the processing tank.

Namely, the flow of the waste solution, which includes the scrapings, into the opening of the inflow portion is promoted by the difference in position of the solution surface. The waste solution flows smoothly without the scrapings remaining at the vicinity of the opening. The efficiency of discharging of the waste solution can thereby be improved.

In this way, the scrapings floating on the surface portion of the processing solution are efficiently removed. Therefore, a filter which is disposed midway along the path of circulation blocks less often. Further, there are fewer scrapings within the processing tank. Stable developing processing can thereby be effected over a long period of time.

In a second aspect of the present invention, a waste solution discharging apparatus for waterless lithographic printing plates is used in a waterless lithographic printing plate developing apparatus, in which a waterless lithographic printing plate is developed while processing solution inside an accommodating tank is pumped out by a circulating pump, supplied to the waterless lithographic printing plate, and recovered in the accommodating tank, and a replenishing solution is replenished periodically. The waste solution discharging apparatus for waterless lithographic printing plates discharges the processing solution, which is within the accommodating tank and which contains scrapings generated after development, as waste solution. The waste solution discharging apparatus for waterless lithographic printing plates includes a collection tank into which a surface portion of the processing solution inside the accommodating tank, along with scrapings floating on the surface portion, flows and is collected. The waste solution discharging apparatus has an inflow portion positioned within the collection tank and has an opening into which processing solution of a surface portion, which includes scrapings floating within the collection tank, flows as waste solution. Material of at least a vicinity of the opening of the inflow portion is a material having low surface tension so that a resistance when the scrapings flow into the opening is reduced. Finally, the waste solution discharging apparatus includes a discharge portion communicating with the inflow portion and discharging the processing solution, flowing in the inflow portion, to an exterior of the accommodating tank.

According to this aspect, the surface portion within the accommodating tank (the processing solution which includes the scrapings) flows into a temporary collection tank, and is then guided to a discharge pipe. Therefore, the scrapings are efficiently discharged so that blockage of the filter and the like is even more infrequent.

In the above-mentioned first and second aspects, it is preferable that the surface tension of the inflow portion be less than or equal to 37 mN/m(dyn/cm). Namely, a first condition is that the material of the inflow portion and the discharge portion, which form the ends of the discharge pipe, and especially the material of the inflow portion, should have a surface tension less than that of vinyl chloride (41.9 mNm(dyn/cm)), which is conventionally used. A second condition is that the material should not easily deteriorate or deform within the solution. With these two conditions in mind, materials having surface tension less than or equal to the 37 mN/m(dyn/cm) surface tension of polyethylene, which is the least expensive material and has a high-quality production characteristic, can be used to achieve the object of the present invention.

Other materials which can be utilized include polypropylene (surface tension 29.4 to 30.1 mN/m(dyn/cm)), and teflon (surface tension 21.5 to 23.9 mN/m(dyn/cm)).

In a third aspect of the present invention, a waste solution discharging apparatus for waterless lithographic printing plates is used in a waterless lithographic printing plate developing apparatus, in which a waterless lithographic printing plate is developed while processing solution inside an accommodating tank is pumped out by a circulating pump, supplied to the waterless lithographic printing plate, and recovered in the accommodating tank, and a replenishing solution is replenished periodically. The waste solution discharging apparatus for waterless lithographic printing plates discharges the processing solution, which is within the accommodating tank and which contains scrapings generated after development, as waste solution. The waste solution discharging apparatus includes an inflow portion positioned within the accommodating tank and having an opening into which processing solution of a surface portion which includes floating scrapings flows as waste solution. The inflow portion has a guide portion for guiding a flow of the processing solution of the surface portion into the opening. Moreover, the waste solution discharging apparatus has a discharge portion communicating with the inflow portion and discharging the processing solution, flowing in the inflow portion, to an exterior of the accommodating tank.

In a fourth aspect, a waste solution discharging apparatus for waterless lithographic printing plates is used in a waterless lithographic printing plate developing apparatus, in which a waterless lithographic printing plate is developed while processing solution inside an accommodating tank is pumped out by a circulating pump, supplied to the waterless lithographic printing plate, and recovered in the accommodating tank, and a replenishing solution is replenished periodically. The waste solution discharging apparatus for waterless lithographic printing plates discharges the processing solution, which is within the accommodating tank and which contains scrapings generated after development, as waste solution. The waste solution discharging apparatus includes a collection tank into which a surface portion of the processing solution inside the accommodating tank, along with scrapings floating on the surface portion, flows and is collected. The waste solution discharging apparatus also has an inflow portion positioned within the collection tank and having an opening into which processing solution of a surface portion which includes floating scrapings flows as waste solution. The inflow portion has a guide portion for guiding a flow of the processing solution of the surface portion into the opening. The waste solution discharging apparatus includes a discharge portion communicating with the inflow portion and discharging the processing solution, flowing in the inflow portion, to an exterior of the accommodating tank.

As the scrapings have certain thicknesses, the bottom portions thereof contact a corner portion of the periphery of the end surface of the opening of the inflow portion. Resistance to the flow of the scrapings thereby increases. As a result, in the third and fourth aspects of the present invention, the scrapings are smoothly guided into the inflow portion by the guide portion. The resistance when the scrapings flow in is thereby reduced, and the scrapings are prevented from remaining at the periphery of the opening.

The inflow portion is formed by a cylindrical portion having the opening at one end. The guide portion can be formed by a taper portion at which a radius of an outer periphery of the cylindrical portion gradually decreases toward the opening along an axial direction of the cylindrical portion. Accordingly, the contact resistance of the scrapings and the guide portion is reduced, and the remaining of the scrapings at the periphery of the discharge pipe can be managed.

Further, the inflow portion may be formed of a material having a low surface tension and provided with a taper-shaped guide portion.

As described above, with the present invention of the waste solution discharging apparatus for waterless lithographic printing plates, superior effects can be achieved in that the scrapings are prevented from remaining on the periphery of the inflow portion and the scrapings are made to flow smoothly into the discharge pipe so that waste solution can be processed.

DESCRIPTION OF THE PREFERRED EMBODIMENTS

Figure 1:
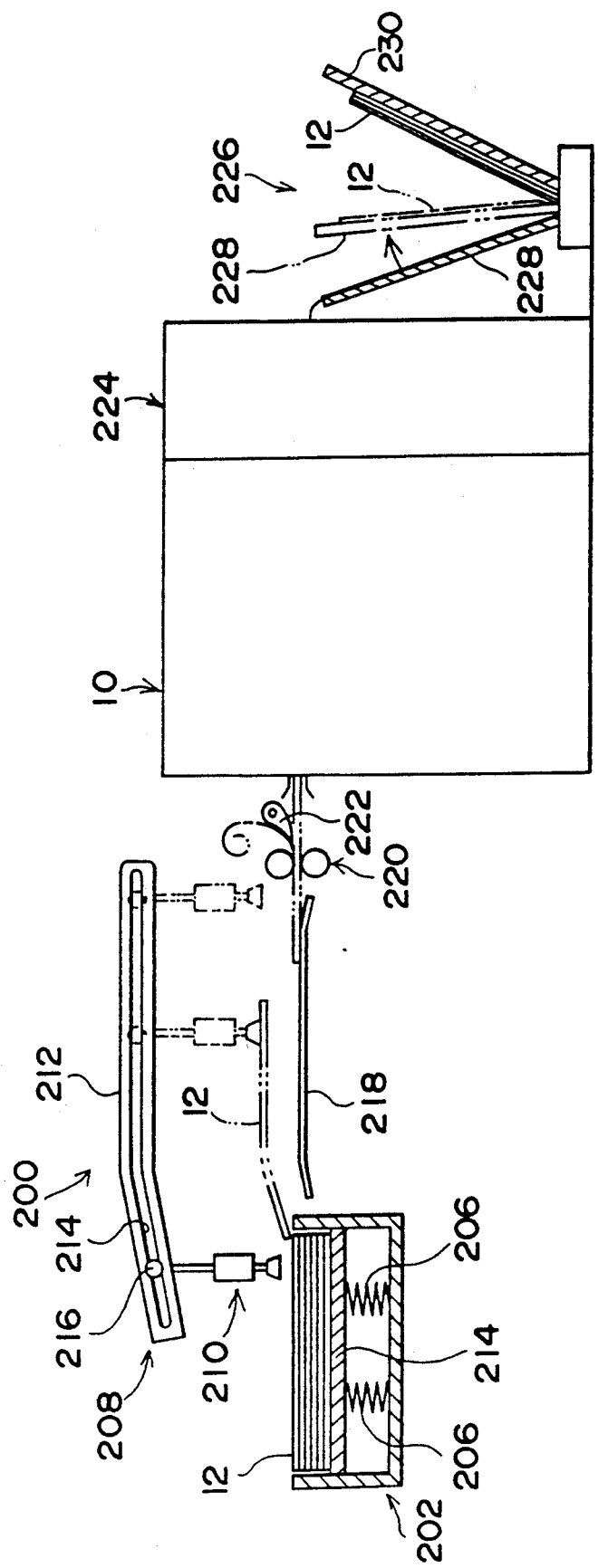
FIG. 1 is a schematic view illustrating an entire structure of a waterless PS plate processor according to the present embodiment.

In FIG. 1, the entire structure of a waterless lithographic printing plate processor 200 relating to the present embodiment is illustrated. Waterless PS plates 12, which have been exposed, are stacked in a box-shaped feeder 202. A receiving stand 214, which supports the waterless PS plates 12, is supported on a bottom portion off the feeder 202 via compression coil springs 206. In this way, the heighthwise position of the topmost waterless PS plate 12 is held virtually constant.

The waterless PS plates 12 which are used here are formed of a primer layer, a photosensitive layer, a silicone rubber layer and a protective film being layered, in that order, upon a base.

A plate supplying mechanism portion 208 is disposed above the feeder 202. The plate supplying mechanism portion 208 is formed of a suction cup portion 210, which sucks the waterless PS plates 12, and a rail portion 212, which supports the suction cup portion 210. An elongated hole 214 is formed in the rail portion 212 in the longitudinal direction thereof. A base portion of the suction cup portion 210 is accommodated in the elongated hole 214 via a shaft 216. As a result, the shaft 216 moves along the elongated hole 214 by the driving power of an unillustrated driving means. Accordingly, the waterless PS plate 12, which is being sucked by the suction cup portion 210, is transported towards a developing apparatus 10.

A guide plate 218 is provided between the feeder 202 and the developing apparatus 10. A pair of rollers 220 are provided at a vicinity of a front end portion of the guide plate 218 in the direction of transport. The waterless PS plate 12 interposed between the rollers 220 is transported further. The protective film applied to the surface is peeled off by a peeling claw 222. The waterless PS plate 12 then reaches the developing apparatus 10.

The structure of the developing apparatus 10 will now be described in detail.

The waterless PS plate 12, which has been developed by the developing apparatus 10, is guided through a washing/drying apparatus 224 to an automatic stacker 226, which is provided at a discharge port of the washing/drying apparatus 224.

The automatic stacker 226 has a substantially V-shaped configuration. The waterless PS plate 12, which is discharged from the discharge port, is disposed so as to lean against a left side wall 228 shown in FIG. 1. In this state, the left side wall 228 rotates with a lower end portion thereof as the center of rotation. The waterless PS plates 12 thereby lean against a right side wall 230 shown in FIG. 1 such that the waterless PS plates 12 are stacked up against the right side wall 230.

Figure 2:
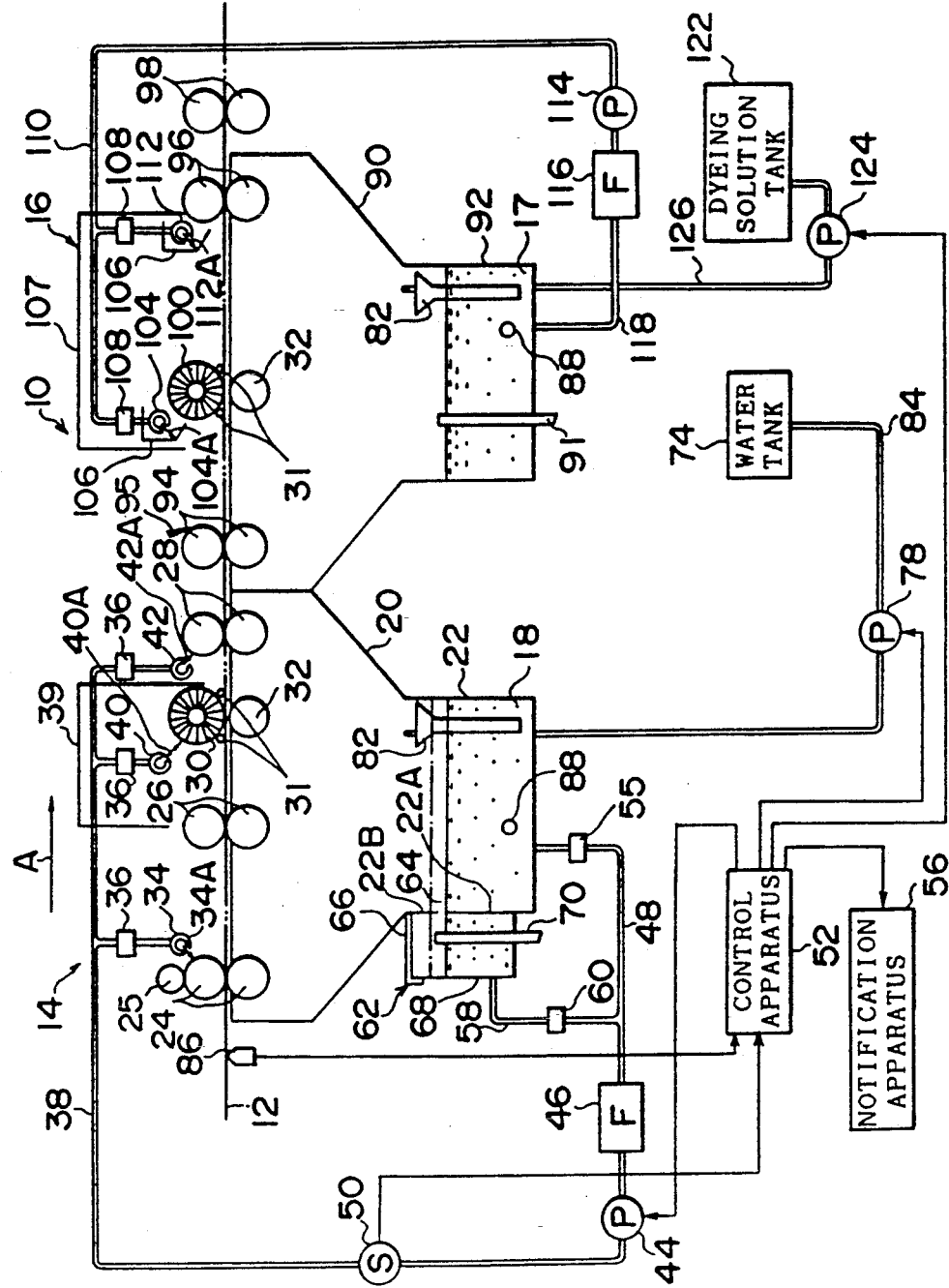
FIG. 2 is a schematic structural view illustrating an embodiment of a waterless lithographic printing plate developing apparatus relating to the present invention.

An embodiment of the waterless lithographic printing plate developing apparatus 10, to which the present invention is applied, is illustrated in FIG. 2. The waterless lithographic printing plate developing apparatus 10 is formed of a developing section 14 and a dyeing section 16. The waterless lithographic printing plate developing apparatus 10 is an apparatus in which dyeing processing, which facilitates inspection of the plates, is effected after the waterless PS plate 12 has been developed.

A dyeing solution 17 containing crystal violet, astrazone red and the like is used in the dyeing section 16.

A top portion of a developing tank main body 20 of the developing section 14 is open. A bottom portion of the developing tank main body 20 is formed as an upside-down mountain. A developing solution recovery tank 22 is formed as a central portion of the bottom portion. Developing water 18 is accommodated within the developing solution recovery tank 22.

As described above, the developing solution 18 contains no organic matter. Regular water, such as tap water or the like, can be used. A antifoaming agent may be mixed in the water so as to prevent foam from developing during circulation of the water. Water hardness may be adjusted by adding a chelating agent. Further, the number of times the water is circulated may be increased by adding a preservative. In order to obtain the same results as use of a preservative, an ozone generating apparatus may be installed.

Pairs of transport rollers 24, 26, 28 are disposed at a top portion of the developing tank main body 20 in that order from the entering side of the waterless PS plate 12. The pairs of transport rollers 24, 26, 28 are supported by an unillustrated rack side plate, and are rotated by a driving force of an unillustrated driving means. Accordingly, the waterless PS plates 12 are interposed between the pairs of transport rollers 24, 26, 28, and are transported in the direction of arrow A shown in FIG. 2.

A back flow preventing roller 25 contacts the upper roller of the pair of transport rollers 24 such that the developing solution 18 is prevented from flowing backward. The back flow preventing roller 25 may also be provided at the other pairs of transport rollers 26, 28.

The pair of transport rollers 28 is disposed at the final portion of the transport path of the waterless PS plate 12 inside the developing section 14. These transport rollers 28 function as squeeze rollers which squeeze out developing solution 18 from the waterless PS plate 12.

A brush roller 30 is disposed between the pair of transport rollers 26 and the pair of transport rollers 28. By brushing the top of the plate surface of the waterless PS plate 12 being transported, the brush roller 30 scrapes off the silicone layer corresponding to the image portions on the plate surface. In the same way as the pairs of transport rollers 24, 26, 28, the brush roller 30 is supported by an unillustrated side plate, and is rotated by a driving force of an unillustrated driving means.

The brush roller 30 is formed by fixing brush elements to a roll made of plastic or metal. The surface of the waterless PS plate 12 is brushed by the brush roller 30 being rotated (correct rotation) in a direction which corresponds to the direction in which the waterless PS plate 12 is transported (counterclockwise rotation in FIG. 2). The number of revolutions of the brush roller 30 is set to 100 to 800 rpm (preferably 200 to 600 rpm). It is also preferable that a waterless PS plate 12 eclipse preventing lever 31 be provided.

The scraping off of the silicone layer on the surface of the waterless PS plate 12 is improved by the brush roller 30 rotating as well as moving reciprocally in the axial direction (hereinafter, this motion is referred to as correct rotation/swinging).

Further, the combination of the direction of rotation of the brush roller 30 and the direction of rotation of a brush roller 100, which will be described later, in the dyeing section 16, can be selected from among the following.

| (developing section 14) | (dyeing section 16) |
|---|---|
| correct rotation/ swinging | reverse rotation/ swinging |
| (the combination utilized in the present embodiment) | |
| correct rotation/ swinging | correct rotation/ swinging |
| correct rotation/ swinging | correct rotation |
| correct rotation/ swinging | reverse rotation |

A roller 32 is disposed at a bottom portion of the brush roller 30. When the waterless PS plate 12 passes, it is interposed between this roller 32 and the brush roller 30, and the surface of the waterless PS plate 12 is brushed by the brush roller 30. The silicone layer corresponding to the image sections is thereby reliably scraped off.

Further, the roller 32 can rotate freely. Therefore, when the waterless PS plate 12 is transported with the brush roller 30 being stopped, the waterless PS plate 12 is inserted smoothly between the brush roller 30 and the roller 32 by the rotation of the roller 32. This type of operation does not occur during actual developing processing, but is effected during inspection of the brushing condition of the brush roller 30.

Namely, the waterless PS plate 12, which has completely been exposed, is interposed between the brush roller 30 and the roller 32. With the brush roller stopped, the waterless PS plate 12 is inserted between the brush roller 30 and the roller 32. The brush roller 30 is thereby rotated, and it can be determined whether the brush width is appropriate or not.

During inspection, the waterless PS plate 12 can be freely inserted in and pulled out with the brush roller 30 being stopped. Therefore, even if the amount of exposure is made small or the amount of brushing by the brush roller 30 is made large, an accurate brush width can be obtained without the portions remaining at the time of insertion and withdrawal being scraped off.

A spray pipe 34 is disposed above the pair of transport rollers 24. The spray pipe 34 opposes the upper roller of the pair of transport rollers 24. Discharge openings 34A are formed in the spray pipe 3A so as to be spaced apart at appropriate distances along the axial direction. The spray pipe 34 communicates with a developing solution supplying apparatus, which will be described later, by a conduit 38 via a valve 36. Accordingly, developing solution 18 is sent to the spray pipe 34, is discharged to the upper roller of the pair of transport rollers 24, and is applied onto the waterless PS plate 12.

Further, spray pipes 40, 42 are disposed between the pair of transport rollers 26 and the pair of transport rollers 28. The spray pipe 40 is disposed between the brush roller 30 and the pair of transport rollers 26. Discharge openings 40A are formed in the spray pipe 40 in the same way as in the aforementioned spray pipe 34. The discharge openings 40A of the spray pipe 40 are provided so as to oppose the brush roller 30. In the same way as the spray pipe 34, the spray pipe 40 communicates with the developing solution supplying apparatus, which will be described later, via a valve 36 by a conduit which diverges from the conduit 38. In this way, developing solution is sent to the spray pipe 40, is discharged to the brush roller 30, and is supplied to the waterless PS plate 12.

The spray pipe 42 opposes the upper roller of the pair of transport rollers 28. Discharge openings 42A are formed in the spray pipe 42. The spray pipe 42 communicates with the developing solution supplying apparatus, which will be described later, via a valve 36 by a conduit which diverges from the conduit 38. Accordingly, developing solution is sent to the spray pipe 42 and is discharged to the upper roller of the pair of transport rollers 28.

A cover 39 having a substantially U-shaped cross section is disposed so as to cover an area from the transport rollers 26 to an upper portion of the brush roller 30. The cover 39 prevents the developing solution 18 from being scattered by the brush roller 30.

The developing solution supplying apparatus is formed of a circulating pump 44, a filter 46, and a conduit 48 by which the circulating pump 44 and the developing solution recovery tank 22 communicate.

The circulating pump 44 is a variable flow rate pump. The circulating pump 44 is connected to a control apparatus 52 by which the discharge flow rate of the circulating pump 44 is controlled. The conduit 38 communicates with the discharge opening side of the circulating pump 44. One end of the conduit 48 communicates with the suction opening side of the circulating pump 44. Another end of the conduit 48 communicates with the bottom portion of the developing solution recovery tank 22 via a valve 55 disposed midway along the conduit 48. By operation of the circulating pump 44, the developing solution inside of the developing solution recovery tank 22 passes through the conduit 48, is sucked by the circulating pump 44, and is sent through the conduit 38 to the spray pipes 34, 40, 42.

A flow rate sensor 50 is disposed midway along the conduit 38 and detects the flow rate of the developing solution flowing within the conduit 38. The flow rate sensor 50 is connected to the controlling apparatus 52, and transmits thereto the results of the detection of the flow rate of the developing solution. The flow rate sensor 50 can employ an ordinary flow meter. However, it is preferable that a rotary-type device be used so that the apparatus may be made more compact.

The filter 46 is disposed midway along the conduit 48 and filters scrapings in the developing solution flowing within the conduit 48. These scrapings are mainly scrapings 18A from the silicone layer which are scraped off of the surface of the waterless PS plate 12.

A notification apparatus 56 is connected to the control apparatus 52 and announces that it is time to change the filter 46 when the flow rate of the developing solution 18 flowing within the conduit 38 is less than or equal to a predetermined flow rate. In this way, the filter can be changed. A filter whose meshes are $10\mu$ to $500\mu$ (preferably $50\mu$ to $300\mu$) is used.

The conduit 48 divides into an offshoot conduit 58 which communicates with an overflow tank 62, which is a collection tank, via a valve 60. The overflow tank 62 is provided at a separating wall on a side portion of the developing solution recovery tank 22, and communicates with the developing solution recovery tank 22 by an elongated hole 64 which extends along the surface of the developing solution. Accordingly the top layer portion of the developing solution 18 within the developing solution recovery tank 22 crosses over the top end portion of a lower portion separating wall 22A and flows into the overflow tank 62. The amount of overflow of developing solution within the overflow tank 62 is 1/10 to $\frac{2}{3}$ (preferably $\frac{1}{8}$ to $\frac{1}{2}$) of the entire amount of developing solution being circulated.

An upper portion separating wall 22B is provided to prevent the scrapings 18A, which are temporarily collected within the overflow tank 62, from spreading into the developing solution recovery tank when the developing solution 18 is replenished by a developing solution replenishing apparatus, to be described later, and the liquid level of the developing solution 18 rises.

A top portion of the overflow tank 62 is open so as to form an opening portion. This opening portion can be opened or closed off by a lid 66. The lid 66 is removed from the opening portion during maintenance of the overflow tank 62. Further, the conduit 58 penetrates through a lower portion of a side wall 68 of the overflow tank 62 so as to communicate therewith. The developing solution within the overflow tank 62 is sucked out by the operation of the circulating pump 44. The surface layer portions of the developing solution inside the developing solution recovery tank 22 flow into the overflow tank 62 due to the suction of the circulating pump 44. The scrapings 18A, which are floating in the developing solution inside the developing solution recovery tank 22, flow into the overflow tank 62 such that the scrapings 18A are collected therein. In this case, a silicone rubber layer, which is used as an ink-resisting layer, is layered on the surface of the waterless PS plate 12. When the silicone rubber layer is scraped off by the brush roller 30 so as to correspond to the image portions, the scraped-off layers become scrapings 18A which are recovered inside of the developing solution recovery tank 22 along with the excess developing solution. Because, in the developing solution within the developing solution recovery tank 22, the specific gravity of the scrapings 18A is lower than that of the developing solution, the scrapings 18A float to the surface portion of the developing solution. Further, the lower portion separating wall 22A serves as a dam as the scrapings 18A of the surface layer inside the developing solution recovery tank 22 flow into and collect in the overflow tank 62. When the liquid level of the developing solution 18 within the overflow tank 62 rises due to replenishment of the developing solution, which will be described later, the upper portion separating wall 22B serves as a dam as it prevents the temporarily collected scrapings 18A from spreading into the developing solution recovery tank 22.

Figure 3:
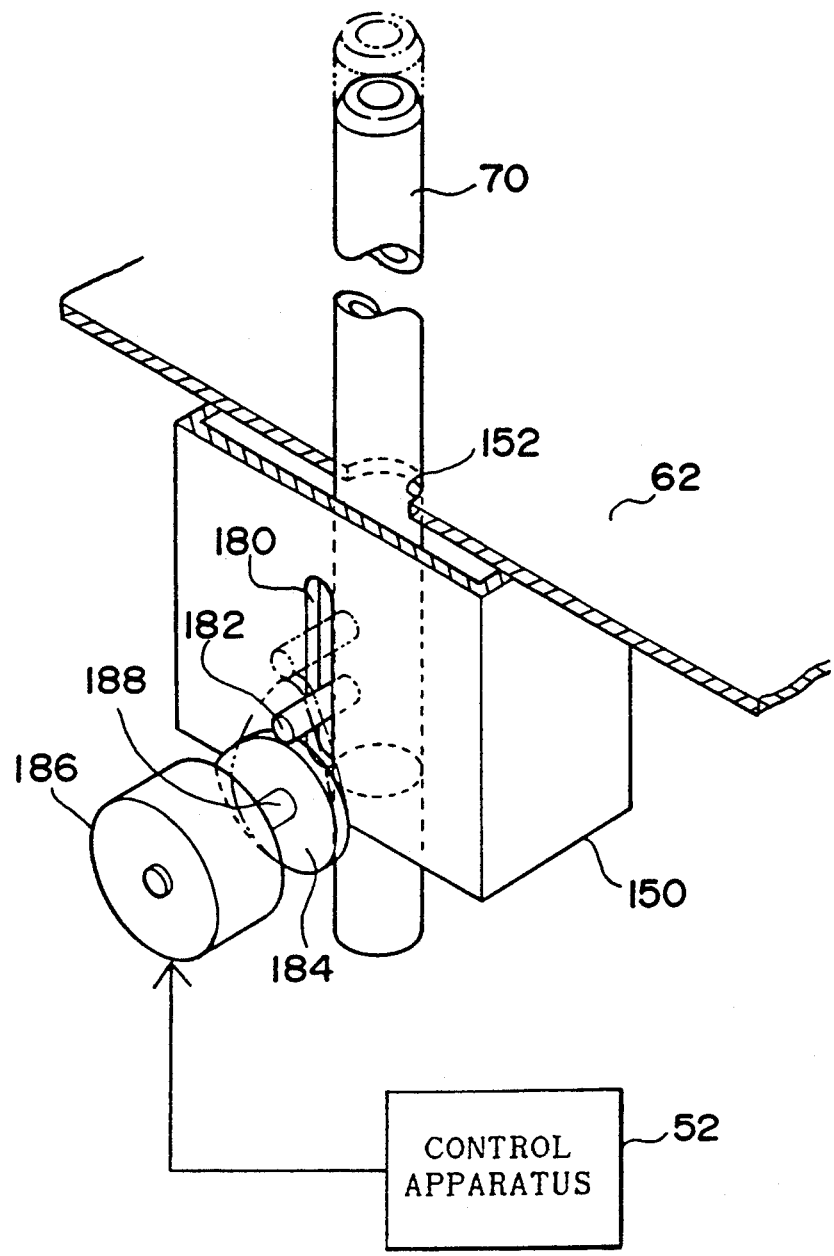
FIG. 3 is a perspective view of a bottom portion of an overflow apparatus.

An overflow pipe 70 is disposed within the overflow tank 62. As shown in FIG. 3, the overflow pipe 70 is inserted through a circular hole 152 provided in the bottom portion of the overflow tank 62. The overflow pipe 70 passes through a supporting block 150, which is mounted beneath the overflow tank 62, and projects out from the supporting block 150.

Figure 4:
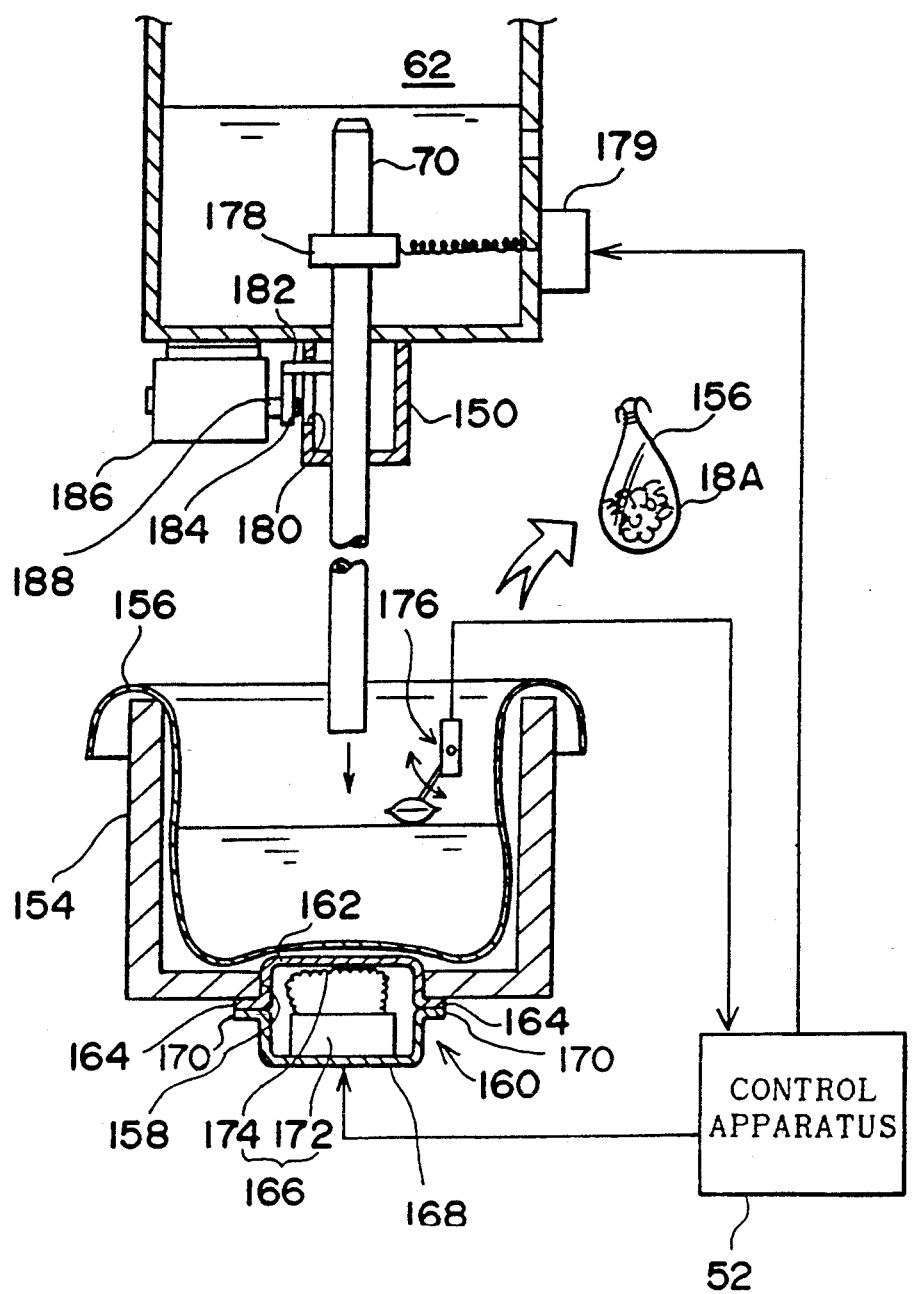
FIG. 4 is a cross section of a waste solution accumulation/evaporation tank.

As shown in FIG. 4, a waste solution accumulation/evaporation tank 154 is disposed beneath the overflow pipe 70. An upper portion of the waste solution accumulation/evaporation tank 154 is formed as an open box. Waste solution flowing out from the overflow pipe is accumulated in the waste solution accumulation/evaporation tank 154. A thin-walled plastic sheet member 156 is spread along the inner periphery of the waste solution accumulation/evaporation tank 154. As a result, the waste solution is accumulated in this sheet member 156.

At the bottom surface of the waste solution accumulation/evaporation tank 154, a through-hole 158 is formed, and a heater unit 160 is mounted. The heating casing 162 of the heater unit 160 is made of metal (preferably aluminum or the like) and is formed in a so-called hat shape. The heating casing 162 penetrates through the through-hole 158 so as to project slightly into the waste solution accumulation/evaporation tank 154. A flange 164 of the heating casing 162 corresponds to a flange 170 of a heating casing main body 168, which is formed as an inverse hat-shape and which accommodates a heater portion 166. The flange 164 and the flange 170 are joined by an unillustrated bolt. A heater driving portion 172, which is connected to the controlling device 52, and a heater wire 174 are provided in the heater portion 166. The heating casing 162 is heated by a predetermined current flowing through the heater wire 174. The waste solution within the waste solution accumulation/evaporation tank 154 is heated by this heat. As a result, the temperature of the waste solution rises, and the water content evaporates.

A floating-type level sensor 176, which is connected to the controlling apparatus 52, is mounted to an upper portion of the waste solution accumulation/evaporation tank 154. The controlling apparatus 52 can recognize when the accumulated amount of waste solution exceeds a given amount. When the controlling apparatus 52 receives such a signal, the controlling apparatus 52 temporarily stops processing and hastens the removal of the waste solution.

Because the scrapings 18A during developing are mixed in with the waste solution, only the scrapings 18A remain after the water content has been evaporated and the waste solution has been condensed. The scrapings 18A are transported along with the above-mentioned sheet member 156 to an appropriate place and is processed (discarded). Namely, the sheet member 156 can be easily removed from the waste solution accumulation/evaporation tank 154 by being lifted out therefrom.

At its usual position (the position indicated by the imaginary line in FIG. 3), the upper end portion of the overflow pipe 70 is set higher than the lower end portion of the upper portion separating wall 22B of the developing solution recovery tank 22. As a result, when the developing solution 18 is replenished by the developing solution replenishing apparatus, which will be described later, and the liquid level of the developing solution 18 within the developing solution recovery tank 22 rises (the position indicated by the dot-chain line in FIG. 2), the overflow pipe 70 submerges. Along with the scrapings 18A, the surface portion of the developing solution 18 within the overflow tank 62 flows out of the overflow tank 62 through the overflow pipe 70.

Figure 5:
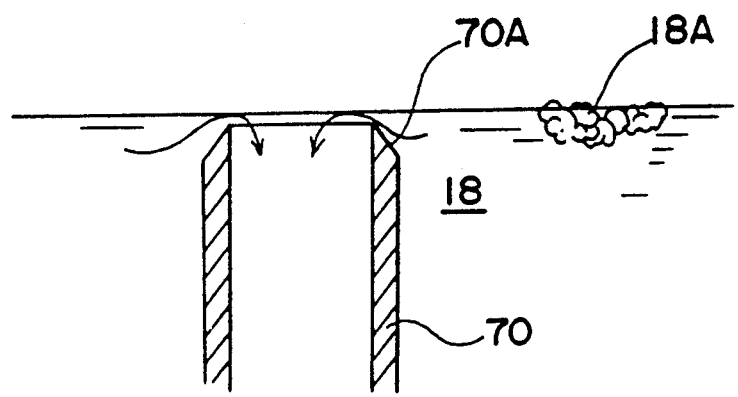
FIG. 5 is a perspective view illustrating a configuration of a top end of an overflow pipe.

As shown in FIG. 5, the shape of the upper end portion of the overflow pipe 70 is such that the diameter of the outer periphery becomes gradually smaller as it nears the top edge and forms a taper portion 70A serving as a guide means. Due to the taper portion 70A, the surface which the scrapings 18A abut is an inclined surface. Therefore, the scrapings 18A smoothly flow down into the overflow pipe 70.

Polypropylene is used as the material for the overflow pipe 70. The surface tension of polypropylene is 29.4 mN/m(=dyn/cm), which is much lower than the surface tension of conventional vinyl chloride pipes, 41.9 mNm. As result, when the scrapings 18A contact the overflow pipe 70, the scrapings 18A do not adhere to the overflow pipe 70 as often. The scrapings 18A thereby flow smoothly along the above-mentioned inclined surface.

Other materials, including polyethylene which has a surface tension of 37 mN/m, may be used, provided that the surface tension is less than or equal to the 37 mN/m value displayed by polyethylene. It is preferable to use a substance whose surface tension is less than or equal to 30 mN/m. Other than the above-mentioned polypropelene, polytetrafluoroethylene (trade name teflon, manufactured by E. J. du Pont de Nemours & Co., Inc.), whose surface tension is 21.5 to 23.9 mN/m, and the like are also applicable. Further, these materials dissolved by appropriate solvents may be applied.

Moreover, it is easy for the scrapings to adhere to portions of wall surfaces and the bottom surface within the developing solution recovery tank which are near the liquid surface of the developing solution 18. However, this adhering can be prevented or decreased by making at least portions of inner walls of the developing recovery tank, which are in a vicinity the liquid surface, from the above-mentioned materials. The adhering may also be prevented or decreased by painting these areas with a paint including the above materials.

As shown in FIG. 4, a vibrator 178 is attached to the periphery of a central portion in the longitudinal direction of the overflow pipe 70. The vibrator 178 produces slight vibrations by a signal from an oscillator 179, which is connected to the control apparatus 52, and vibrates the overflow pipe 70. Due to these vibrations, the movement of the scraping 18A along the aforementioned inclined surface can be accelerated without the scrapings 18A stopping in the vicinity of the top end of the overflow pipe 70.

Further, as shown in FIG. 3, an elongated hole 180 is provided in a side surface of the supporting block 150. A projecting portion 182 projects radially from the peripheral surface of the overflow pipe 70 and penetrates through the elongated hole 180. The projecting portion 182 is supported by a eccentric cam 184. The eccentric cam 184 is fixed to a rotating shaft 188 of a motor 186 which is attached to the overflow tank 62. The motor 186 is driven by a signal from the control apparatus 52. When the eccentric cam 184 rotates by the driving of the motor 186, the projecting portion 182 moves up and down along the elongated hole 180 such that the overflow pipe 70 moves up and down.

When the projecting portion 182 is positioned at the lowest end of the elongated hole 180 (as shown by the solid line in FIG. 3), the difference between the top end of the overflow pipe 70 and the liquid surface becomes large. The developing solution flowing down in the overflow pipe 70 can thereby be made to flow more quickly. Incidentally, the overflow pipe 70 is ordinarily located at the position shown by the imaginary line in FIG. 3.

As shown in FIG. 2, the developing solution replenishing apparatus is formed by a water tank 74, in which water is accommodated, and a water supplying pump 78, which is used to supply water to the interior of the developing solution recovery tank 22. The water sent to the developing solution recovery tank 22 by the water supplying pump 78 is sent into a wide-opening conduit 82. The wide-opening conduit 82 is pipe-shaped, and the water is discharged from an opening at a lower end portion thereof.

The control apparatus 52 is disposed at the entry side of the developing section 14. An aluminum detector 86, which detects the amount of waterless PS plate 12 passing through, i.e., the amount to be processed (the surface area of the waterless PS plate 12), is connected to the control apparatus 52, and supplies the information regarding the amount to be processed to the control apparatus 52. A plurality of photoelectric tubes are disposed in the aluminum detector 86 along the transverse direction of the waterless PS plate 12 so as to measure the time in which the waterless PS plate 12 passes by the upper portion of the aluminum detector 86. Accordingly, the area of the surface of the plate may be detected. It also suffices to input in advance the length of the transverse direction of the waterless PS plate 12, and detect the surface area by detecting the length with a single photoelectric tube.

A heater 88 is disposed at the bottom portion of the developing solution recovery tank 22. The heater 88 is connected to an unillustrated power source and heats the developing solution 18. The temperature of the developing solution 18 is set at 15° C. to 60° C. (preferably 25° C. to 50° C.) by the heater 88.

The developing time in the present apparatus is set to 10 seconds to 3 minutes (preferably 30 seconds to 2 minutes). The dyeing time is set to 5 seconds to 1 minute (preferably 10 seconds to 30 seconds). A developing tank may be added as occasion demands.

Next, the dyeing section 16 will be described.

The top portion of a dyeing tank main body 90 of the dyeing section 16 is open in the same way as in the developing tank main body 20. The bottom portion of the dyeing tank main body 90 is formed as an upside-down mountain. A dyeing solution recovery tank 92 is formed in a central portion of the bottom portion of the dyeing tank main body 90. Dyeing solution 17 is accommodated within the dyeing solution recovery tank 92. An overflow pipe 91 is disposed within the dyeing solution recovery tank 92. An upper end of the overflow pipe 91 is positioned in an upper portion of the dyeing solution recovery tank 92. A lower end of the overflow pipe 91 penetrates through the bottom of the dyeing solution recovery tank 92 and projects toward the exterior. The liquid surface within the dyeing solution recovery tank 92 rises as dyeing solution is replenished by a dyeing solution replenishing apparatus, which will be described later. When the liquid surface rises above the upper end of the overflow pipe 91, the dyeing solution 17 is discharged from the interior of the dyeing solution recovery tank 92 to the outside via the overflow pipe 91. The height of the liquid surface of the dyeing solution 17 is thereby set.

Pairs of transport rollers 94, 96 are disposed in the top portion of the dyeing tank main body 90 along the transport direction of the waterless PS plate 12 in that order from the entry side of the dyeing tank main body 90. The transport rollers 94, 96 are supported by an unillustrated rack side plate and are rotated by driving force from an unillustrated driving means. The waterless PS plate 12 is thereby interposed between and transported by the respective pairs of transport rollers 94, 96. The pairs of transport rollers 94, 96 are made of ordinary rubber so that the surface of the waterless PS plate 12 being transported will not be damaged.

A top end portion of a blade 95 contacts the upper roller of the pair of transport rollers 94. Accordingly, the scrapings which adhere to the pair of transport rollers 94 are scraped off by the blade 95 such that the smoothness of the surface of the pair of transport rollers 94 is maintained. The blade 95 also prevents the developing solution 18, which adheres to the upper roller of the pair of transport rollers 94, from adhering to the waterless PS plate 12 again as the upper roller of the pair of transport rollers 94 rotates.

The blade 95 may also be provided at the pair of transport rollers 96.

A pair of transport rollers 98 is disposed at the side of the dyeing tank main body 90 which is downstream in the transport direction of the waterless PS plate 12. The pair of transport rollers 98 is formed of NBR (nitrile butadiene rubber) or molten rollers or the like such that the wiping off of the dyeing solution 17 is improved.

A brush roller 100 is disposed between the pair of transport rollers 94 and the pair of transport rollers 96. In the same way as the pairs of transport rollers 94, 96, the brush roller 100 is supported by an unillustrated side plate, and is rotated in the direction opposite to the direction of rotation of the pairs of transport rollers 94, 96 (the brush roller 100 rotates in the clockwise direction in FIG. 2) by a driving force of an unillustrated driving means. The brush roller 100 is formed by fixing brush elements to a roll made of plastic or metal. The surface of the waterless PS plate 12 is brushed by the brush roller 100 being rotated in the direction (clockwise direction in FIG. 2) opposite to the transport direction of the waterless PS plate 12. Depending on the circumstances, the brush roller 100 may also be rotated in the transport direction of the waterless PS plate 12. The number of revolutions of the brush roller 100 is set to 100 to 800 rpm (preferably 200 to 600 rpm). It is also preferable that an eclipse preventing lever be provided in order to prevent the eclipsing of the waterless PS plate 12.

The roller 32 is provided beneath the brush roller 100. As a result, when the waterless PS plate 12 passes by, it is interposed between the brush roller 100 and the roller 32 and transported. The dyeing solution 17 is applied to the surface of the waterless PS plate 12 by the brush roller 100.

A spray pipe 104 is disposed above the brush roller 100. The spray pipe 104 is enclosed by a substantially U-shaped flow-adjusting plate 106. An appropriate number of discharge openings 104A, which oppose the flow-adjusting plate 106, are provided in the spray pipe 104 along the axial direction thereof.

The spray pipe 104 communicates with the dyeing solution supplying apparatus, which will be described later, by a conduit 110 via a valve 108. In this way, dyeing solution 17 is sent to the spray pipe 104, is discharged toward the flow-adjusting plate 106, is guided by the flow-adjusting plate 106, and is supplied to the brush roller 100. At this time, the dyeing solution 17 flows down from the top of the flow-adjusting plate 106 and spreads so as to be supplied evenly onto the brush roller 100.

A spray pipe 112 is disposed between the brush roller 100 and the pair of transport rollers 96 at the side of the pair of transport rollers 96. In the same way as the spray pipe 104, the spray pipe 112 is enclosed by the substantially U-shaped flow-adjusting plate 106. An appropriate number of discharge openings 112A, which oppose the flow-adjusting plate 106, are provided in the spray pipe 112 along the axial direction thereof. In the same way as the spray pipe 104, the spray pipe 112 communicates with the dyeing solution supplying apparatus, which will be described later, by a conduit 110 via a valve 108. In this way, dyeing solution 17 is sent to the spray pipe 112, is discharged toward and guided by the flow-adjusting plate 106, and is supplied to the upper roller of the pair of transport rollers 96. At this time, the dyeing solution 17 flows down from the top of the flow-adjusting plate 106 and spreads so as to be supplied evenly onto the pair of transport rollers 96.

A cover 107 having a substantially U-shaped cross section is disposed above the brush roller and the pair of transport rollers 96. The cover 107 prevents the dyeing solution from being scattered by the brush roller 100.

The dyeing solution supplying apparatus is formed by a circulating pump 114, a filter 116, and a conduit 118, which communicates the circulating pump 114 and the dyeing solution recovery tank 92. The conduit 110 communicates with the discharge opening side of the circulating pump 114. One end of the conduit 118 communicates with the suction opening side of the circulating pump 114. Another end of the conduit 118 communicates with the bottom portion of the dyeing solution recovery tank 92. By the operation of the circulating pump 114, the dyeing solution within the dyeing solution recovery tank 92 flows through the conduit 118, is sucked by the circulating pump 114, and flows through the conduit 110 to be sent to the spray pipes 104, 112.

The filter 116 is disposed midway along the conduit 118 and removes scrapings from the dyeing solution flowing within the conduit 118. These scrapings are mainly scrapings from the photosensitive layer and the silicone layer which are scraped off of the surface of the waterless PS plate 12 which is brought from the developing section 14.

The dyeing solution replenishing apparatus is formed by a dyeing solution tank 122, in which the dyeing solution 17 is accommodated, and a dyeing solution supplying pump 124, which is used to supply dyeing solution to the interior of the dyeing solution recovery tank 92.

One end of a conduit 126 communicates with the dyeing solution tank 122. Another end of the conduit 126 opens at a wide-opening conduit 182, which is disposed within the dyeing solution recovery tank 92. The dyeing solution supplying pump 124 is disposed midway along the conduit 126. The dyeing solution supplying pump 124 is connected to the control apparatus 52 such that the operational timing, i.e., the operation during replenishment of the dyeing solution 17, is controlled by the control apparatus 52. The replenishing amount of the dyeing solution 17 is set to be 5 to 100 cc/m$^2$ (preferably 10 to 60 cc/m$^2$).

A heater 188 is disposed within the dyeing solution recovery tank 92 at a bottom portion thereof. The heater 188 is connected to an unillustrated power source so as to heat the dyeing solution 17. The temperature of the dyeing solution 17 is set to 15° C. to 45° C. (preferably 20° C. to 40° C.). Dyeing tanks may be added as occasion demands.

Next, the operation of the present embodiment will be described.

After passing above the aluminum detector 86, the waterless PS plate 12, on which images have been printed at an unillustrated image printing apparatus, is inserted into the developing section 14. The portions of the photosensitive layer of the waterless PS plate 12 which have been irradiated by light, i.e., the exposed portions, harden and adhere to the silicone layer. The unexposed portions, harden swell or can be eluted by the developing solution 18.

Next, the protective film which has been laminated onto the surface of the waterless PS plate 12 in order to protect it, is peeled off by the peeling claw 222. Thereafter, the waterless PS plate 12 is inserted into the developing section 14. As the waterless PS plate 12 is interposed between and transported by the pair of transport rollers 24 of the developing section 14, the developing solution 18 is applied to the surface of the waterless PS plate 12. Accordingly, the photosensitive layer of the unexposed portions (image portions) of the waterless PS plate 12 swell and are easily peeled off of the silicone layer.

The waterless PS plate 12 is interposed between and transported by the pair of transport rollers 26, and is inserted between the brush roller 30 and the roller 32. The brush roller 30 rotates in a direction corresponding to the transport direction of the waterless PS plate 12 (the brush roller 30 rotates counterclockwise in FIG. 2). The top surface of the waterless PS plate 12, which is being transported on top of the roller 32, is brushed. The developing solution 18 is also being supplied to the brush roller 30. While the developing solution 18 is supplied to the waterless PS plate 12, the surface is brushed by the brush roller 30. The silicone rubber layer, which has swelled or has been eluted by the developing solution 18, is scraped off. In this way, the portions of the photosensitive layer and the silicone rubber layer which correspond to the exposed portions of the waterless PS plate 12 (non-image portions) remain, and positive images are thereby formed.

The developing solution 18 which is left over, after developing, from the developing solution 18 applied to the surface of the waterless PS plate 12 falls down into the developing solution recovery tank 22 and is recovered.

Further, as the waterless PS plate 12, from which the unexposed portions (image portions) of the silicone layer have been scraped off by the brush roller 30, is interposed between the pair of transport rollers 28 and transported, the developing solution 18 is again applied thereto. The developing solution 18 is squeezed out from the waterless PS plate 12. In this state, the waterless PS plate 12 is inserted between the pair of transport rollers 94 of the dyeing section 16. The waterless PS plate is interposed between and transported by the pair of transport rollers 94, and is thereby inserted between the brush roller 100 and the roller 32. The brush roller 100 rotates in the direction opposite to the transport direction of the waterless PS plate 12 (the brush roller 100 rotates clockwise in FIG. 2). The dyeing solution 17, which is guided and supplied by the flow-adjusting plate 106, is applied to the top surface of the waterless PS plate 12. In this way, the dyeing solution 17 bonds to the photosensitive layer, i.e., the unexposed portions (image portions) such that the image portions are dyed.

The waterless PS plate 12 is inserted between the pair of transport rollers 96. The dyeing solution 17, which has been guided and supplied by the flow-adjusting plate 106 to the upper roller of the pair of transport rollers 96, is applied to the surface of the waterless PS plate 12, and is squeezed out. The surfaces of the image portions and the non-image portions of the developed waterless PS plate 12 are dyed the same color. This dyeing is a process which allows the image portions and the non-image portions to be more easily distinguished and which is effected for the inspection operation.

The waterless PS plate 12, whose image portions have been dyed, is delivered out from the dyeing section 16. Thereafter, the waterless PS plate 12 is inserted between the pair of transport rollers 98 so that the dyeing solution remaining on the surface thereof is wiped off. Because the pair of transport rollers 98 is formed of NBR or of molten rollers, the wiping off of the dyeing solution is improved. If the dyeing solution 17 remains on the non-image portions in particular, the ink resistance of the silicone rubber layer deteriorates. Therefore, a high-quality print cannot be obtained during printing. However, because the dyeing solution is reliably squeezed out from the surface by the pair of transport rollers 98, a high-quality print can be obtained. Washing and drying processes may be provided after the aforementioned processes.

Next, the circulation of the developing solution 18 in the developing section 14, the removal of scrapings, and the replenishment of the developing solution 18 will be described.

Circulation

As shown in FIG. 2, the developing solution 18 within the developing solution recovery tank 22 is sent to the spray pipes 34, 40, 42 by the operation of the circulating pump 44. The developing solution 18 is applied to the waterless PS plate 12 which is being transported through the developing section 14. The excess developing solution 18 after application of the developing solution 18 to the waterless PS plate 12 falls down and is recovered within the developing solution recovery tank 22. The scrapings 18A, such as the silicone layer and the like which have been peeled from the surface of the waterless PS plate 12, are included in the developing solution which is recovered within the developing solution recovery tank 22. Because the specific gravity of the scrapings 18A is less than that of the developing solution, the scrapings 18A float on the surface portion of the developing solution within the developing solution recovery tank 22.

Removal of Scrapings

The developing solution within the developing solution recovery tank 22 flows over the lower portion separating wall 22A and flows into the overflow tank 62. Accordingly, the scrapings 18A, which float on the surface portion of the developing solution 18, flow into the overflow tank 62 and are collected therein.

If the filter 46 becomes blocked by the scrapings 18A, the circulating flow rate of the developing solution 18 flowing within the conduit 38 deteriorates. The flow rate sensor 50 detects this condition and transmits the detection results to the control apparatus 52. The control apparatus 52 operates the notification apparatus 56 which announces that the filter 46 is blocked. In this way, the operator can know when it is time to replace the filter 46 with a new one.

When the developing solution recovery tank 22 is replenished with developing solution, the height of the liquid level of the developing solution within the developing solution recovery tank 22 rises. When the developing solution rises above the elongated hole 64, the height of the liquid level of the developing solution (on whose surface portion the scrapings 18A collect) within the overflow tank 62 also rises. The top end portion of the overflow pipe 70 is thereby submerged. At this time, when the motor 186 is driven and the eccentric cam 184 is rotated, the projecting portion 182, which is supported by the eccentric cam 184, reaches the bottom end of the elongated hole 180. The overflow pipe 70 moves even further downward such that the difference between the top edge of the overflow pipe 70 and the liquid surface can increase.

Accordingly, the developing solution, beginning with the surface portion (on which the scrapings 18A are floating), passes into the overflow pipe 70 and is discharged outside. The top end portion of the overflow pipe 70 is formed as the taper portion 70A, and the overflow pipe 70 is made of polypropylene, which has low surface tension. Therefore, the scrapings 18A smoothly flow down the overflow pipe 70 without adhering to the area around the opening. Further, in this case, the overflow pipe 70 is lowered. Therefore, the flow velocity is accelerated, and the scrapings 18A do not stop.

Further, the wall surfaces of the recovery tank have been processed in a similar way so as to prevent the scrapings from adhering thereto. Therefore, dirtying of the recovery tank can be prevented, and the tank may be cleaned less frequently.

Figure 6:
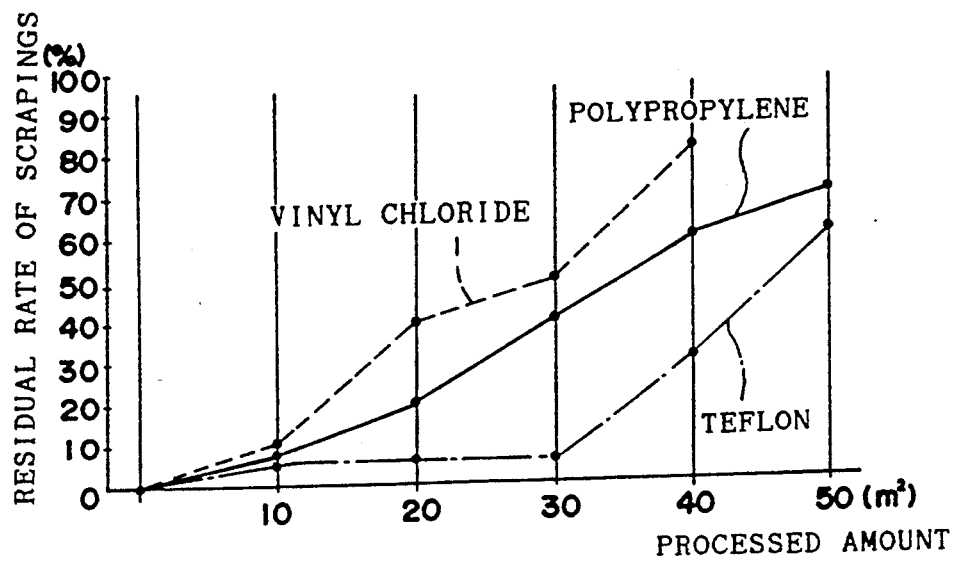
FIG. 6 is a view illustrating the residual rate feature of the processed amount/scrapings according to differences in materials of the overflow pipe.

FIG. 6 illustrates residual rates of the scrapings according to differences in materials of the overflow pipe 70 in accordance with the following conditions.

Experimental Conditions

Replenishing 500 cc of developing solution at the point when a 10 $m^2$ dot image exposed plate has passed through For polypropylene (the solid line in FIG. 6), which is applied to the present embodiment, the residual rate of the scrapings in accordance with the processed amount exhibits an upward trend. Compared with vinyl chloride (the dotted line in FIG. 6), the conventional material, the grade of the polypropylene line is smaller, and the residual rate is lower.

Further, when teflon (the dot-chain line in FIG. 6) is used, a 5% residual rate can be maintained until processing of 30 m².

Figure 7:
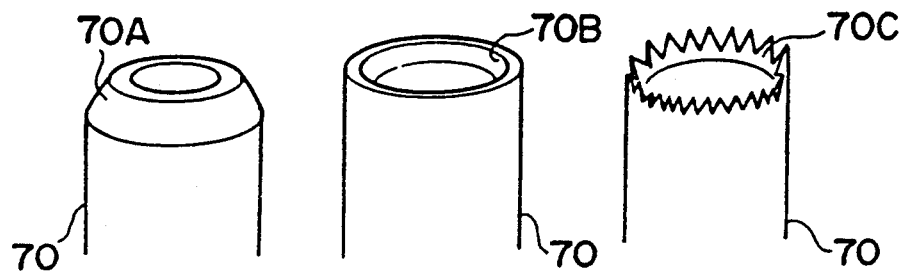
FIG. 7 is a perspective view illustrating top end configurations of overflow pipes formed for testing.

As shown in FIG. 7, in order to compare results according to configuration of the taper portion 70A serving as a guide means, the end portion of the overflow pipe 70 was formed as a concave portion 70B and as a toothed portion 70C, in addition to the taper portion 70A. The residual rates were observed under the same conditions as those mentioned above. At this time, the combination of the end portion configuration with the material of the overflow pipe 70 was also taken into consideration.

Figure 8:
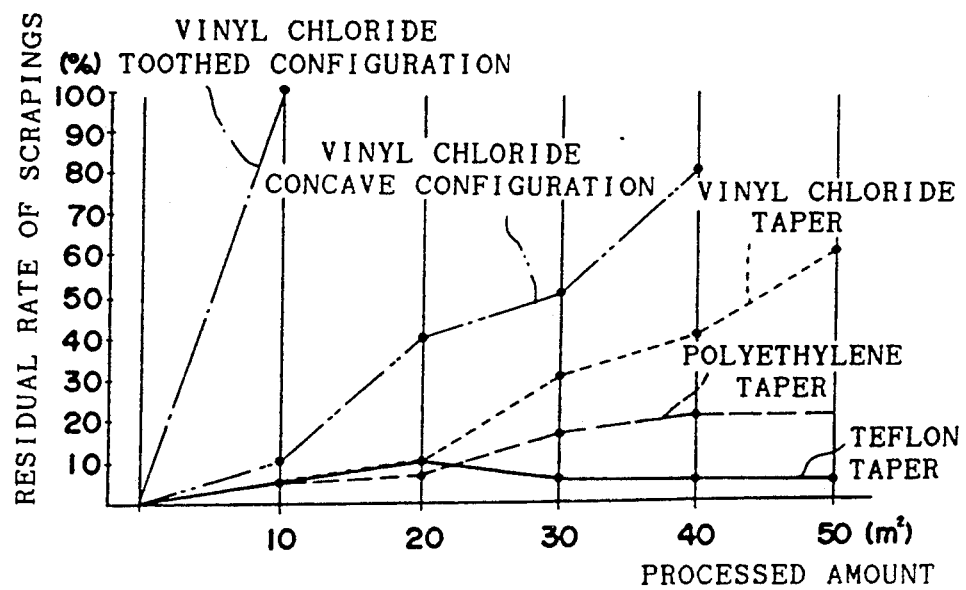
FIG. 8 is a view illustrating the residual rate feature of the processed amount/scrapings according to the combination of the material of the overflow pipe and the top end configuration.

The results are displayed in FIG. 8. The toothed portion 70C made of vinyl chloride has a residual rate of 100% at a processed amount of 10 m². The toothed portion 70C results in an adverse effect.

The characteristics of the concave portion 70B made of vinyl chloride are not very different from those of the conventional configuration made of vinyl chloride, as shown in FIG. 6. The concave portion 70B does not contribute in any way to guiding the scrapings.

Next, when the vinyl chloride taper portion 70A is used, the rise in the grade is low. By using the taper portion 70A, the amount of the scrapings remaining can be controlled. When the combination of the taper portion 70A and polyethylene is used, it barely clears the permissible limit of 20%. With the combination of the taper portion 70A and teflon, the residual rate of the scrapings is always maintained at 5 to 10% regardless of the processed amount, and sufficient results are thereby obtained.

Moreover, when the vibrator 178 is operated, the scrapings 18A are prevented from stopping. Therefore, the flowing of the scrapings 18A along the inclined surface can be facilitated.

At this time, the upper portion separating wall 22B, in which the elongated hole 64 is formed, of the developing solution recovery tank 22 functions as a dam. The scrapings, which are temporarily collected within the overflow tank 62, thereby do not spread into the developing solution recovery tank 22 when the developing solution surface rises due to the replenishment of the developing solution.

In this way, in the present embodiment, the scrapings 18A are discharged outside by the overflow pipe 70 when the water is replenished. Therefore, there is less blocking of the filter, and stable developing processing can be effected for a long period of time. Further, the circulation route of the developing solution 18 is formed into two routes by the offshoot conduit 58 and the conduit 48 such that the scrapings 18A can be removed from the developing solution 18. Therefore, the scrapings 18A do not stop at the developing solution recovery tank 22 and the circulating pump 44, and their maintenance is facilitated.

The developing solution (waste water) which flows into the overflow pipe 70 is guided to the waste solution accumulation/evaporation tank 154. The heater unit 160 is provided in the waste solution accumulation/evaporation tank 154 such that the waste solution accumulated in the waste solution accumulation/evaporation tank 154 is heated. Due to this heating, the water content in the waste solution evaporates, and only the scrapings 18A remain.

When the amount of evaporated water content is less than the amount of solution which flows into the overflow pipe 70, the amount of waste solution within the waste solution accumulation/evaporation tank 154 gradually increases. This condition is detected by the level sensor 176, and a signal is sent to the control apparatus 52. Here, the control apparatus 52 judges that the waste solution has become full of water, and stops processing. By disposing of the waste solution while processing is stopped, waste solution is prevented from overflowing from the waste solution accumulation/evaporation tank 154.

When the scrapings 18A remaining in the waste solution accumulation/evaporation tank 154 reach a predetermined amount, the scrapings 18A are taken out of the waste solution accumulation/evaporation tank 154 along with the sheet material 156, and are disposed of. The scrapings 18A are in a condensed state and contain almost no water. Therefore, the sheet material 156 is easy to carry, there is no polluting of the environment, and the scrapings 18A can be disposed of properly be incineration or the like.

Replenishment of Developing Water

The waterless PS plate 12 inserted into the developing section 14 and the amount to be processed are detected by the aluminum detector 86.

The control apparatus 52 operates the water supplying pump 74, based on the results of the above-mentioned detection, so that developing solution is supplied to the developing solution recovery tank 22. This replenishing is effected in accordance with the amount to be processed, i.e., the surface area, of the waterless PS plate 12.

The replenishing amount of the water is set to be 250 to 2000 cc for each time the developing solution is replenished.

Next, the replenishing of the dyeing solution 17 of the dyeing section 16 will be explained.

The developing solution 18 remains on the surface of the waterless PS plate 12 inserted into the dyeing section 16. In this state, the dyeing solution 17 is applied. As a result, the dyeing solution 17 recovered in the dyeing solution recovery tank 92 after dyeing contains developing solution 18. The quality of the dyeing solution 17 thereby deteriorates. The quality of the dyeing solution 17 also deteriorates due to the amount of the waterless PS plate 12 dyed. As a result, the control apparatus 52 operates the dyeing solution supplying pump 124 based on the results of the detection of the surface area of the waterless PS plate 12 by the aluminum detector 86. The dyeing solution 17 is thereby supplied to the dyeing solution recovery tank 92. Accordingly, stable dyeing can be effected for a long period of time without the dyeing capability of the dyeing solution 17 deteriorating.

In the present embodiment, the top end portion of the overflow pipe 70 is set to a height such that it is submerged when the liquid surface rises due to the replenishment of the developing solution 18. However, the present invention is not limited to the same. The top end portion 18 of the overflow pipe 70 may be set to a height so that it will be positioned slightly lower than the height of the liquid surface of the developing solution 18 when the developing solution 18 is circulated. The scrapings 18A can thereby be discharged from the overflow pipe 70 during circulation as well.

In the present embodiment, the entire overflow pipe is made of a material, such as polypropylene or the like, whose surface tension is low. However, the top end portion may be formed as a separate member, and the material of just this separate member may be varied.

Further, the taper portion 70A is formed as the guide means in the present embodiment. However, the top end portion of the overflow pipe may be formed as a spherical surface.

Figure 9:
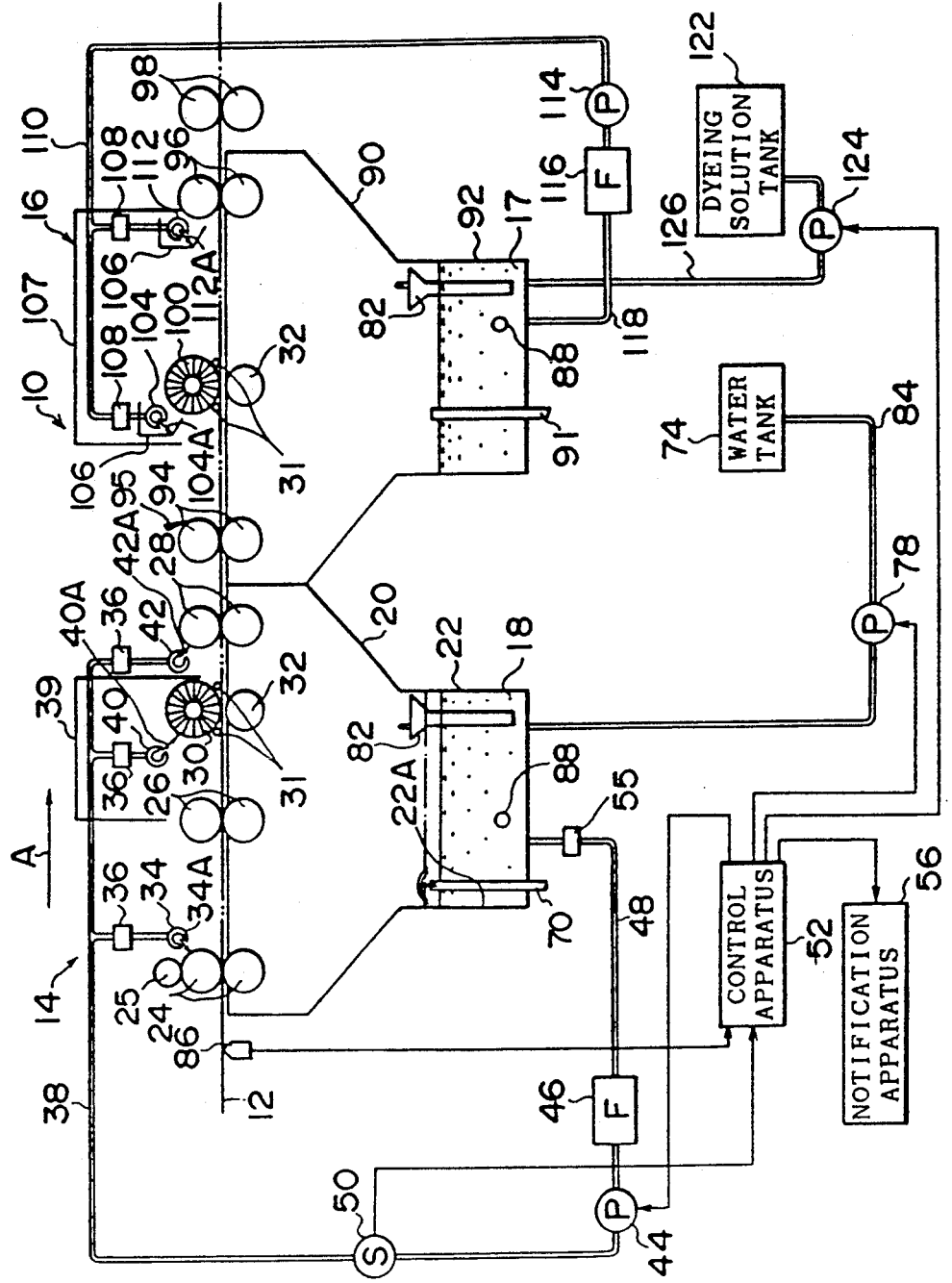
FIG. 9 is a schematic view of the waterless lithographic printing plate developing apparatus when the overflow tank is omitted.

In the present embodiment, the overflow tank 62 is provided adjacent to the developing solution recovery tank 22. After the surface portion of the developing solution 18 flows from the elongated hole 64, which is provided between the upper portion separating wall 22B and the lower portion separating wall 22A, into the overflow tank 62, the surface portion is guided to the overflow pipe 70. However, as illustrated in FIG. 9, the structure may be simplified by eliminating the overflow tank and providing the overflow pipe 70 within the developing solution recovery tank 22.

With this structure, the efficiency of the recovery (discharge) of the scrapings is slightly inferior compared with the aforementioned embodiment. However, when compared with conventional structures, recovery efficiency is good due to the material of the overflow pipe 70 and the taper configuration of the top end portion. Therefore, by simplifying the structure, the amount of parts and space can be decreased. Moreover, there is less adhering of the scrapings to the inside of the recovery tank, and maintenance work becomes easy.

What is claimed is:

1. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and replenishing solution is replenished periodically, said waste solution discharging apparatus for waterless lithographic printing plates discharging the processing solution, which is within said accommodating tank and which contains scrapings generated after development, as waste solution, comprising:

an inflow portion positioned within said accommodating tank and having an opening into which processing solution of a surface portion which includes floating scrapings flows as waste solution, wherein the material forming at least a part of said opening of said inflow portion has low surface tension so that a resistance when the scrapings flow into said opening is reduced; and a discharge portion communicating with said inflow portion and discharging the processing solution, flowing in said inflow portion, to an exterior of said accommodating tank.

2. A waste solution discharging apparatus for waterless lithographic printing plates according to claim 1, wherein surface tension of said material is less than or equal to 37 mN/m(dyn/cm).

3. A waste solution discharging apparatus for waterless lithographic printing plates according to claim 2, wherein surface tension of said material is less than or equal to 30 mN/m(dyn/cm).

4. A waste solution discharging apparatus for waterless lithographic printing plates according to claim 2, wherein said material is one of polypropylene, polyethylene and teflon.

5. A waste solution discharging apparatus for waterless lithographic printing plates according to claim 1, wherein said inflow portion and said discharge portion are respectively provided at an end portion and another end portion of a single substantially cylindrical pipe body.

6. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and replenishing solution is replenished periodically, said waste solution discharging apparatus for waterless lithographic printing plates discharging the processing solution, which is within said accommodating tank and which contains scrapings generated after development, as waste solution, comprising:

an inflow portion positioned within said accommodating tank and having an opening into which processing solution of a surface portion which includes floating scrapings flows as waste solution, wherein the material forming at least a part of said opening of said inflow portion has low surface tension so that a resistance when the scrapings flow into said opening is reduced; and a discharge portion communicating with said inflow portion and discharging the processing solution, flowing in said inflow portion, to an exterior of said accommodating tank, wherein said inflow portion and said discharge portion are respectively provided at an end portion and another end portion of a single substantially cylindrical pipe body; and further comprising vibrating means for vibrating said pipe body.

7. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and replenishing solution is replenished periodically, said waste solution discharging apparatus for waterless lithographic printing plates discharging the processing solution, which is within said accommodating tank and which contains scrapings generated after development, as waste solution, comprising:

an inflow portion positioned within said accommodating tank and having an opening into which processing solution of a surface portion which includes floating scrapings flows as waste solution, wherein the material forming at least a part of said opening of said inflow portion has low surface tension so that a resistance when the scrapings flow into said opening is reduced; and a discharge portion communicating with said inflow portion and discharging the processing solution, flowing in said inflow portion, to an exterior of said accommodating tank, wherein said inflow portion and said discharge portion are respectively provided at an end portion and another end portion of a single substantially cylindrical pipe body; and further comprising displacing means for displacing a position of said opening in directions of a depth of said accommodating tank.

8. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

a collection tank into which a surface portion of the processing solution inside said accommodating tank, along with scrapings floating on the surface portion, flows and is collected;

an inflow portion positioned within said collection tank and having an opening into which processing solution of a surface portion, which includes scrapings floating within said collection tank, flows as waste solution, wherein the material forming at least a part of said opening of said inflow portion has low surface tension so that a resistance when the scrapings flow into said opening is reduced; and a discharge portion communicating with said inflow portion and discharging the processing solution, flowing in said inflow portion, to an exterior of said accommodating tank.

9. A waste solution discharging apparatus for waterless lithographic printing plates according to claim 8, wherein surface tension of said material is less than or equal to 37 mN/m(dyn/cm).

10. A waste solution discharging apparatus for waterless lithographic printing plates according to claim 9, wherein surface tension of said material is less than or equal to 30 mN/m(dyn/cm).

11. A waste solution discharging apparatus for waterless lithographic printing plates according to claim 9, wherein said material is one of polypropylene, polyethylene and teflon.

12. A waste solution discharging apparatus for waterless lithographic printing plates according to claim 8, wherein said inflow portion and said discharge portion are respectively provided at an end portion and another end portion of a single substantially cylindrical pipe body.

13. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

a collection tank into which a surface portion of the processing solution inside said accommodating tank, along with scrapings floating on the surface portion, flows and is collected;

an inflow portion positioned within said collection tank and having an opening into which processing solution of a surface portion, which includes scrapings floating within said collection tank, flows as waste solution, wherein the material forming at least a part of said opening of said inflow portion has low surface tension so that a resistance when the scrapings flow into said opening is reduced; and a discharge portion communicating with said inflow portion and discharging the processing solution, flowing in said inflow portion, to an exterior of said accommodating tank, wherein said inflow portion and said discharge portion are respectively provided at an end portion and another end portion of a single substantially cylindrical pipe body; and further comprising vibrating means for vibrating said pipe body.

14. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

a collection tank into which a surface portion of the processing solution inside said accommodating tank, along with scrapings floating on the surface portion, flows and is collected;

an inflow portion positioned within said collection tank and having an opening into which processing solution of a surface portion, which includes scrapings floating within said collection tank, flows as waste solution, wherein the material forming at least a part of said opening of said inflow portion has low surface tension so that a resistance when the scrapings flow into said opening is reduced; and a discharge portion communicating with said inflow portion and discharging the processing solution, flowing in said inflow portion, to an exterior of said accommodating tank, wherein said inflow portion and said discharge portion are respectively provided at an end portion and another end portion of a single substantially cylindrical pipe body; and further comprising displacing means for displacing a position of said opening in directions of a depth of said collection tank.

15. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

an inflow portion positioned within said accommodating tank and having an opening into which processing solution of a surface portion, which includes floating scrapings, flows as waste solution, said inflow portion having a guide portion for guiding a flow of the processing solution of said surface portion into said opening, said quide portion being shaped such that a resistance when the scrapings flow into said opening is reduced; and a discharge portion communicating with said inflow portion and discharging the processing solution, flowing in said inflow portion, to an exterior of said accommodating tank.

16. A waste solution discharging apparatus for waterless lithographic printing plates according to claim 15, wherein said inflow portion is formed by a cylindrical portion having said opening at one end, and said guide portion is formed by a taper portion at which a radius of an outer periphery of said cylindrical portion gradually decreases toward said opening along an axial direction of said cylindrical portion.

17. A waste solution discharging apparatus for waterless lithographic printing plates according to claim 15, wherein at said guide portion, the material forming at least a part of said opening has low surface tension so that a resistance when the scrapings flow into said opening is reduced.

18. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

an inflow portion positioned within said accommodating tank and having an opening into which processing solution of a surface portion, which includes floating scrapings, flows as waste solution, said inflow portion having a guide portion for guiding a flow of the processing solution of said surface portion into said opening;

a discharge portion communicating with said inflow portion and discharging the processing solution, flowing in said inflow portion, to an exterior of said accommodating tank, wherein said inflow portion is formed by a cylindrical portion having said opening at one end, and said guide portion is formed by a taper portion at which a radius of an outer periphery of said cylindrical portion gradually decreases toward said opening along an axial direction of said cylindrical portion; and a vibrating means for vibrating said opening.

19. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

an inflow portion positioned within said accommodating tank and having an opening into which processing solution of a surface portion, which includes floating scrapings, flows as waste solution, said inflow portion having a guide portion for guiding a flow of the processing solution of said surface portion into said opening, said guide portion being shaped such that a resistance when the scrapings flow into said opening is reduced; and a discharge portion communicating with said inflow portion and discharging the processing solution, flowing in said inflow portion, to an exterior of said accommodating tank, wherein said inflow portion is formed by a cylindrical portion having said opening at one end, and said guide portion is formed by a taper portion at which a radius of an outer periphery of said cylindrical portion gradually decreases toward said opening along an axial direction of said cylindrical portion; and further comprising displacing means for displacing a position of said opening in directions of a depth of said accommodating tank.

20. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

a collection tank into which a surface portion of the processing solution inside said accommodating tank, along with scrapings floating on the surface portion, flows and is collected;

an inflow portion positioned within said collection tank and having an opening into which processing solution of a surface portion, which includes floating scrapings, flows as waste solution, said inflow portion having a guide portion for guiding a flow of the processing solution of said surface portion into said opening, said guide portion being shaped such that a resistance when the scrapings flow into said opening is reduced; and a discharge portion communicating with said inflow portion and discharging the processing solution, flowing in said inflow portion, to an exterior of said accommodating tank.

21. A waste solution discharging apparatus for waterless lithographic printing plates according to claim 20, wherein said inflow portion is formed by a cylindrical portion having said opening at one end, and said guide portion is formed by a taper portion at which a radius of an outer periphery of said cylindrical portion gradually decreases toward said opening along an axial direction of said cylindrical portion.

22. A waste solution discharging apparatus for waterless lithographic printing plates according to claim 20, wherein at said guide portion, the material forming at least a part of said opening has low surface tension so that a resistance when the scrapings flow into said opening is reduced.

23. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

- a collection tank into which a surface portion of the processing solution inside said accommodating tank, along with scrapings floating on the surface portion, flows and is collected;
- an inflow portion positioned within said collection tank and having an opening into which processing solution of a surface portion, which includes floating scrapings, flows as waste solution, said inflow portion having a guide portion for guiding a flow of the processing solution of said surface portion into said opening;
- a discharge portion communicating with said inflow portion and discharging the processing solution, flowing in said inflow portion, to an exterior of said accommodating tank; and
- a vibrating means for vibrating said opening.

24. A waste solution discharging apparatus for waterless lithographic printing plates which is used in a waterless lithographic printing plate developing apparatus, in which a waterless lithographic printing plate is developed while processing solution inside an accommodating tank is pumped out by a circulating pump, supplied to the waterless lithographic printing plate, and recovered in said accommodating tank and a replenishing solution is replenished periodically, said waste solution discharging apparatus for waterless lithographic printing plates discharging the processing solution, which is within said accommodating tank and which contains scrapings generated after development, as waste solution, comprising:

- a collection tank into which a surface portion of the processing solution inside said accommodating tank, along with scrapings floating on the surface portion, flows and is collected;
- an inflow portion positioned within said collection tank and having an opening into which processing solution of a surface portion, which includes floating scrapings, flows as waste solution, said inflow portion having a guide portion for guiding a flow of the processing solution of said surface portion into said opening;
- a discharge portion communicating with said inflow portion and discharging the processing solution, flowing in said inflow portion, to an exterior of said accommodating tank; and
- a displacing means for displacing a position of said opening in directions of a depth of said accommodating tank.

* * * * *